(12) United States Patent  
Bachman et al.

(10) Patent No.: US 8,877,074 B2
(45) Date of Patent: Nov. 4, 2014

(54) METHODS OF MANUFACTURING MICRODEVICES IN LAMINATES, LEAD FRAMES, PACKAGES, AND PRINTED CIRCUIT BOARDS

(75) Inventors: Mark Bachman, Irvine, CA (US); Guann-Pyng Li, Irvine, CA (US)

(73) Assignee: The Regents of the University of California, Oakland, CA (US)

( * ) Notice: Subject to any disclaimer, the term of this patent is extended or adjusted under 35 U.S.C. 154(b) by 1409 days.

(21) Appl. No.: 12/112,925

(22) Filed: Apr. 30, 2008

(65) Prior Publication Data

US 2008/0283180 A1 Nov. 20, 2008

Related U.S. Application Data

(63) Continuation-in-part of application No. 11/956,756, filed on Dec. 14, 2007.

(60) Provisional application No. 60/870,354, filed on Dec. 15, 2006, provisional application No. 60/915,310, filed on May 1, 2007.

(51) Int. Cl.
*B32B 37/02* (2006.01)
*H01B 13/00* (2006.01)
*B81C 1/00* (2006.01)

(52) U.S. Cl.
CPC ..... *B81C 1/00182* (2013.01); *B81B 2203/0118* (2013.01); *B81C 1/00253* (2013.01); *B81B 2203/0109* (2013.01)
USPC .................. 216/13; 156/60; 156/121; 216/33

(58) Field of Classification Search
None
See application file for complete search history.

(56) References Cited

U.S. PATENT DOCUMENTS

| | | | | |
|---|---|---|---|---|
| 5,588,597 | A * | 12/1996 | Reinecke et al. | 239/553.5 |
| 5,809,646 | A * | 9/1998 | Reinecke et al. | 29/890.1 |
| 6,027,630 | A * | 2/2000 | Cohen | 205/135 |
| 7,198,704 | B2 * | 4/2007 | Cohen et al. | 205/118 |
| 8,092,696 | B2 * | 1/2012 | Nakamura et al. | 216/16 |
| 8,153,908 | B2 * | 4/2012 | Iida et al. | 174/262 |
| 8,168,893 | B2 * | 5/2012 | Ito et al. | 174/260 |
| 2002/0007961 | A1 * | 1/2002 | Yamato et al. | 174/250 |
| 2002/0086456 | A1 * | 7/2002 | Cunningham et al. | 438/57 |
| 2003/0021004 | A1 * | 1/2003 | Cunningham et al. | 359/290 |
| 2003/0026078 | A1 * | 2/2003 | Komatsubara et al. | 361/746 |
| 2004/0146611 | A1 * | 7/2004 | Arias et al. | 426/106 |
| 2004/0251142 | A1 * | 12/2004 | Cohen et al. | 205/223 |
| 2005/0122627 | A1 * | 6/2005 | Kanagawa et al. | 360/245.9 |
| 2006/0016553 | A1 * | 1/2006 | Watanabe | 156/272.2 |
| 2009/0120457 | A1 * | 5/2009 | Naghshineh et al. | 134/2 |
| 2009/0211786 | A1 * | 8/2009 | Bamba et al. | 174/250 |
| 2011/0272013 | A1 * | 11/2011 | Moslehi | 136/255 |
| 2012/0012160 | A1 * | 1/2012 | Moslehi | 136/251 |
| 2012/0174860 | A1 * | 7/2012 | Moslehi | 117/223 |

* cited by examiner

*Primary Examiner* — Allan Olsen
(74) *Attorney, Agent, or Firm* — Kenneth S. Roberts; ONE LLP

(57) ABSTRACT

Systems and methods for producing micromachined devices, including sensors, actuators, optics, fluidics, and mechanical assemblies, using manufacturing techniques of lead frames, substrates, microelectronic packages, printed circuit boards, flex circuits, and rigid-flex materials. Preferred embodiments comprise using methods from post-semiconductor manufacturing to produce three-dimensional and free-standing structures in non-semiconductor materials. The resulting devices may remain part of the substrate, board or lead frame which can then used as a substrate for further packaging electronic assembly operations. Alternatively, the devices may be used as final components that can be assembled within other devices.

20 Claims, 10 Drawing Sheets

217 (A)

219 (B)

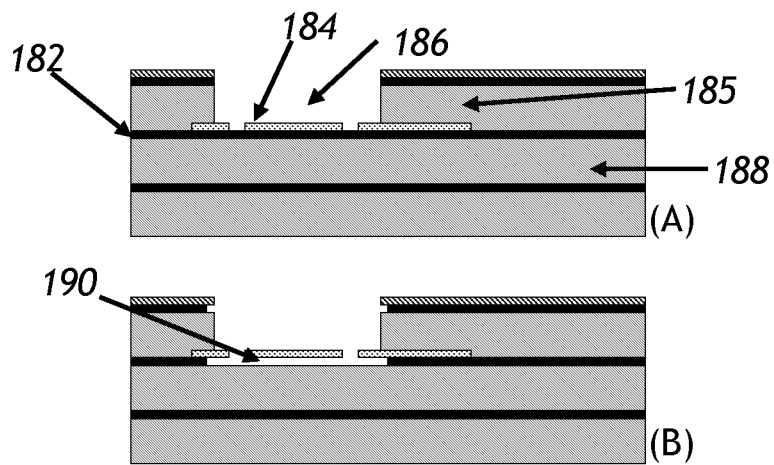
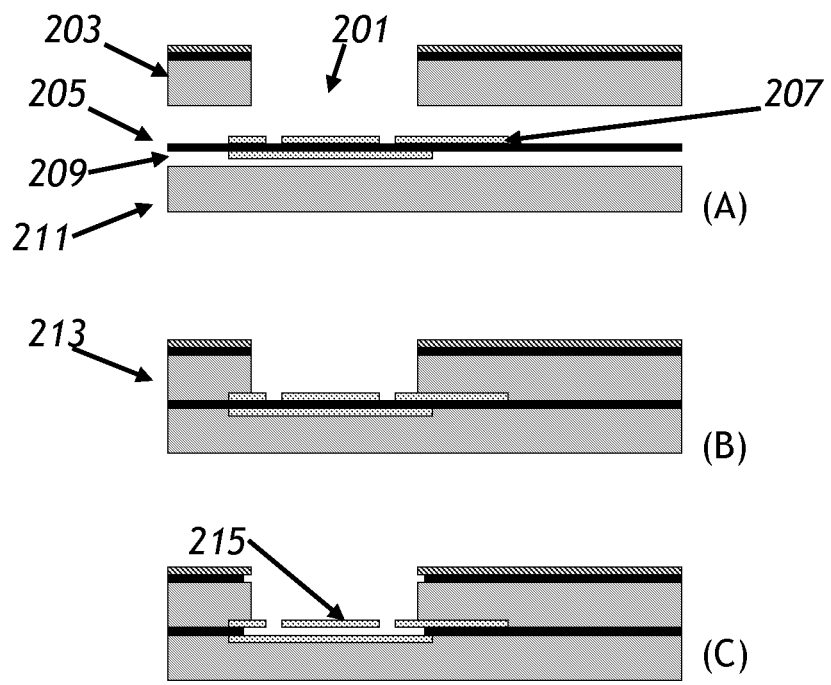
FIGURE 10
FIGURE 11
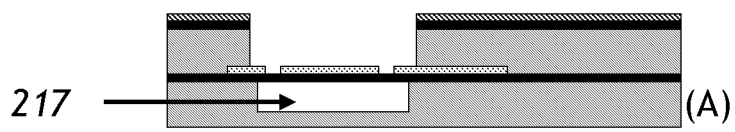
FIGURE 12

METHODS OF MANUFACTURING MICRODEVICES IN LAMINATES, LEAD FRAMES, PACKAGES, AND PRINTED CIRCUIT BOARDS

CROSS-REFERENCE TO RELATED APPLICATION

This application is a continuation-in-part of application Ser. No. 11/956,756 filed Dec. 14, 2007, which claims the benefit of provisional application Ser. No. 60/870,354, filed Dec. 15, 2006, which applications are incorporated herein by reference. This application also claims the benefit of provisional application Ser. No. 60/915,310, filed May 1, 2007, which application is incorporated herein by reference.

This invention was made with Government support under Grant No. DC007714 awarded by the National Institutes of Health. The Government has certain rights to this invention.

FIELD OF THE INVENTION

The present invention relates to methods of manufacturing micromachined devices directly within or on any of the following: lead frames, substrates, microelectronic packages, printed circuit boards, flex circuits, and rigid-flex materials.

BACKGROUND

Microelectrical-mechanical systems (MEMS) are miniature mechanical devices intended to perform non-electronic functions such as sensing or actuation. These devices are typically built from silicon using lithographic techniques borrowed from the semiconductor industry. Some examples of these devices are silicon pressure sensors and silicon accelerometers. Other manufacturing methods have been developed such as microembossing, stamping, microinjection molding, precision machining, and the like. These are typically used to build devices from non-silicon materials such as polymer or metal, for applications where silicon is not an appropriate material. Examples of such devices include microfluidic devices, biochips and optical devices. However, almost all micromachined devices must eventually be placed in a protective housing so that electrical connections can be made to the devices, and to protect the devices. This is troublesome for MEMS devices because they are fragile and so extreme care must be taken to move them from their fabricated substrates (e.g., wafers) to micro-electronic packages. It is well known that 60%-80% of the final cost for a MEMS device is from the costs associated with packaging.

The use of silicon for MEMS microfabrication has its roots in the successes of the semiconductor industry. Early MEMS designers in the 1980's looked to the semiconductor industry as a model for building small devices. Other manufacturing industries, such as precision machining, printed circuit board manufacturing, and microelectronic packaging did not have the manufacturing sophistication needed to produce devices with feature sizes in the few microns. In current times, however, these non-semiconductor industries have developed highly sophisticated tooling needed to do high precision manufacturing. These industries are now in an ideal position to take on the job of manufacturing MEMS devices.

There are at least four major manufacturing steps needed to make a final electronic product. These are:

1. Semiconductor manufacturing: A semiconductor manufacturer builds microcircuits on semiconductor material such as silicon ("microchips").

2. Package base manufacturing: A substrate or lead frame manufacturer builds thin mechanical base structures for the chips. These can be laminate structures ("laminates") or single precision cut layers of metal foil ("lead frames").

3. Packaging: A packaging manufacturer assembles the chips on the base structures, makes electrical attachments, then puts a protective covering on them ("package").

4. Printed circuit board manufacturing: A printed circuit board manufacturer makes a multilayer electrical laminate ("printed circuit board") then takes assemblies and bonds packaged chips on the laminate to produce a final part ("printed circuit").

For the purpose of this discussion, we will identify the last three manufacturing steps as "post semiconductor manufacturing" or PSM.

While MEMS devices have been built using semiconductor manufacturing techniques, little work has been done to demonstrate fabrication of MEMS using the three PSM techniques described above. There are several advantages that could be realized if MEMS devices were built using PSM techniques instead of the semiconductor approach. These are 1. Cheaper manufacturing: Non-semiconductor manufacturing is much cheaper than semiconductor manufacturing.

2. Better materials selection: Post-semiconductor manufacturing allows many more materials and to be included in the manufacturing process, including low temperature materials such as polymers.

3. Easier integration: Post-semiconductor manufacturing provides more flexible methods for manufacturing.

4. More variety: More materials and more manufacturing options yields a greater number of devices that can be designed and developed. Silicon is very limited in its uses.

5. Easier packaging: Since devices are built in packaging materials, using packaging techniques, packaging is easier to design.

Although MEMS devices can be built using manufacturing techniques that come from the PSM fields, little work is done in that area today. Thus it is desirable to provide methods for producing 3-D structures and free-standing structures using PSM techniques.

SUMMARY

The various embodiments and examples provided herein are generally directed to systems and methods for producing micromachined devices using manufacturing techniques of lead frames, substrates, microelectronic packages, printed circuit boards, flex circuits, and rigid-flex materials. A micromachined device refers to a small device (less than 5 mm overall size) whose function is not primarily electronic in nature. These include sensors, actuators, optics, fluidics, and mechanical assemblies.

Preferred embodiments comprise using methods from post-semiconductor manufacturing (PSM) to produce three-dimensional and free-standing structures in non-semiconductor materials. The resulting devices may remain part of the substrate, board or lead frame which can then used as a substrate for further packaging electronic assembly operations. Alternatively, the devices may be used as final components that can be assembled within other devices.

Several manufacturing embodiments are provided herein. One embodiment is the method of first patterning a microstructure on a carrier, then processing the carrier and microstructure according to normal manufacturing procedures, then removing part of the carrier at the end of the manufacturing process.

Another embodiment is to use a pick-and-place operation to move an encapsulated microstructure to a surface, or alternatively, to move components on to an embedded microstructure.

Another embodiment is to create a mold cavity within a laminate structure by creating openings in the laminates and building up the cavity one layer at a time.

The manufacturing processes provided herein are compatible with existing processes for building these items, so they enable new classes of devices to be built using the same technology. The manufacturing techniques can be applied to the manufacture of micromachined microdevices as stand-alone products, or for building micromachined microdevices that are part of the lead frames, substrates, microelectronic packages, printed circuit boards, flex circuits, and rigid-flex materials.

Other objects and features of the present invention will become apparent from consideration of the following description taken in conjunction with the accompanying drawings.

BRIEF DESCRIPTION OF THE FIGURES

The details of the invention, both as to its structure and operation, may be gleaned in part by study of the accompanying figures, in which like reference numerals refer to like parts. The components in the figures are not necessarily to scale, emphasis instead being placed upon illustrating the principles of the invention. Moreover, all illustrations are intended to convey concepts, where relative sizes, shapes and other detailed attributes may be illustrated schematically rather than literally or precisely.

FIG. 10 is a diagram showing a second process for creating free-standing structure in laminate.

FIG. 11 is a diagram showing a third process for creating free-standing structure in laminate.

FIG. 12 is a diagram showing a process fabricating a microdevice with an electret and an all-air gap.

DETAILED DESCRIPTION OF THE PREFERRED EMBODIMENTS

Figure 1:
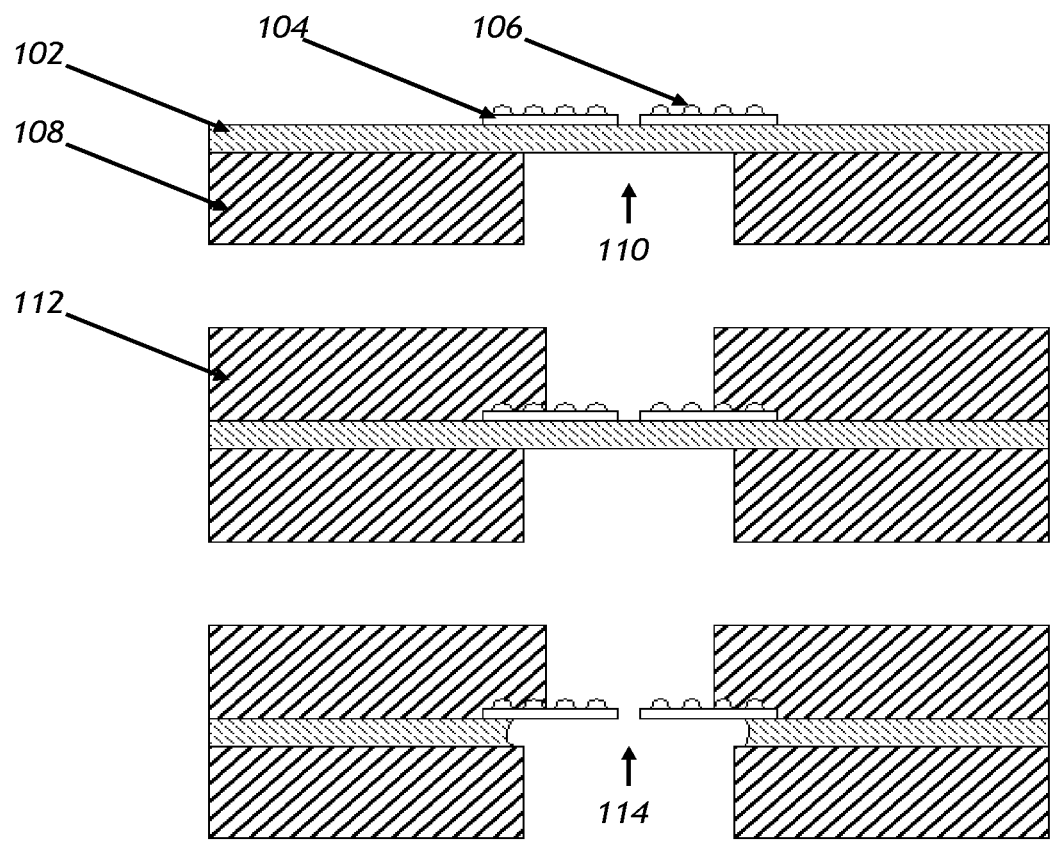
FIG. 1 is an illustration of a manufacturing process using a thin sheet carrier to provide the structural support for subsequent manufacturing steps.

Each of the additional features and teachings disclosed below can be utilized separately or in conjunction with other features and teachings to accomplish post-semiconductor manufacturing techniques that can result in three-dimensional structures and freestanding devices. Representative examples of the present invention, which examples utilize many of these additional features and teachings both separately and in combination, will now be described in further detail with reference to the attached drawings. This detailed description is merely intended to teach a person of skill in the art further details for practicing preferred aspects of the present teachings and is not intended to limit the scope of the invention. Therefore, combinations of features and steps disclosed in the following detail description may not be necessary to practice the invention in the broadest sense, and are instead taught merely to particularly describe representative examples of the present teachings.

Moreover, the various features of the representative examples and the dependent claims may be combined in ways that are not specifically and explicitly enumerated in order to provide additional useful embodiments of the present teachings. In addition, it is expressly noted that all features disclosed in the description and/or the claims are intended to be disclosed separately and independently from each other for the purpose of original disclosure, as well as for the purpose of restricting the claimed subject matter independent of the compositions of the features in the embodiments and/or the claims. It is also expressly noted that all value ranges or indications of groups of entities disclose every possible intermediate value or intermediate entity for the purpose of original disclosure, as well as for the purpose of restricting the claimed subject matter.

The following descriptions are of basic manufacturing processes that can be deployed in the manufacture of microdevices. These processes are all typically available in post-semiconductor manufacturing. Microdevices are built using one or more of these processes, as will be described later.

Lamination: Layering thin sheets or films of material and bonding together using pressure, heat or adhesives, or any combination of these.

Lithography: Patterning a light sensitive material by selectively exposing it to light, as through a mask or through the movement of a thin beam of light.

Deposition: Placement of material on a surface through any means, including spraying, dipping, spinning, dry film laminating, painting.

Vapor deposition: Placement of material on a surface through the vapor phase, such as by vapor film growth, evaporation, sputtering and the like.

Etch: Selective removal of material using a chemical reaction or physical erosion to dissolve or breakdown the material. Chemical reaction can take place in the liquid or gas/vapor phase.

Electroplating: Use of electrolytic reactions to put material, usually metal, on a surface.

Electrodeposition: Use of electric fields to place a material, usually a polymer, on a surface.

Stenciling: Placement of material at selected regions on a surface by using a physical stencil to obstruct certain regions. Also, the use of a stencil to protect certain regions from etch.

Laser machining: Use of a laser to remove material through melting, vaporizing or ablation. Also, laser machining may mean the use of a laser to assist in other processes such as laser assisted etch.

Machining: Use of a sharp tool to remove a material from a surface. This includes common operations such as sawing, drilling, milling, lathing, reaming, tapping, and the like.

EDM: Electron discharge machining, the use of an electrical current to etch or cut materials.

Water jet machining: Use of a high pressure water jet, sometimes filled with abrasive materials, to cut or etch materials.

Sandblasting: Use of abrasives blown at high velocity to etch a surface.

Dispensing: Placement of flowable material on a surface by pushing through a nozzle or ejecting from a reservoir.

Ink-jet printing: Placement of liquid material on a surface by ejecting through a nozzle.

Offset printing: Placement of liquid material on a second surface by placing the material on a first surface, then bringing that surface in contact with the second surface.

Electrostatic printing: Placement of charged material on a surface by charging the surface in specific regions, then allowing the charged materials to move and settle on the charged regions.

Assembly: Mechanical placement of components on a material.

Joining: Physical connection of two materials.

Bonding: Physical connection of two materials in such a way as to make the connection permanent or semi-permanent, such as through adhesives, welding, diffusion, or the use of mechanical joining structures.

Molding: Forming a shape by pushing a flowable material into a predefined cavity.

Embossing: Forming a shape by pressing a predefined cavity against a flowable material.

Encapsulation: Covering one material with a flowable second material.

Turning to the figures, a plurality of methods for building 3-D structures and free-standing structures using these basic processes will be described.

Free Standing Structure Using a Thin Sheet Carrier.

Referring to FIG. 1 a manufacturing process is depicted as using a thin sheet carrier to provide the structural support for subsequent manufacturing steps. The process includes preparing a thin sheet carrier 102 preferably from copper foil. A photosensitive material (photoresist) (not shown) is then deposited on the surface of the thin sheet carrier 102 and patterned using lithography. A second material 104, preferably a second metal, is then deposited on the surface of the thin sheet carrier 102, preferably by electroplating through the openings in the photoresist. Alternatively, the second material 104 can be deposited prior to lithography, then etched through the openings in the photoresist. Following either of the photoresist is stripped. The patterned second material (patterned microstructure) 104 is left on the thin sheet carrier 102. The thin sheet carrier 102 acts as a structural support for subsequent manufacturing steps. The process may be repeated to produce further microstructures 106 on the thin sheet carrier 102.

The foil 102 may be bonded against another material 108, if desired, using any convenient process including lamination, molding, deposition, or processes listed above. The layers 108 may contain openings 110 and/or structures, or may have openings and structures machined into it. Various manufacturing steps may be performed on the foil 102 including laminating another material 112 to foil 102, joining, bending, cutting, drilling, and the like as listed above.

After subsequent manufacturing, parts of the thin sheet carrier 102 are etched away to reveal a freestanding structure 114. Etching may be performed from either side of the thin sheet carrier 102, or both sides, depending on the specific need of the final device, and depending on manufacturing convenience. If etching must occur through the top side of the carrier 102, then holes may be patterned in the patterned microstructures 104 and 106 to allow etching to occur under the patterned microstructures 104 and 106.

Alternatively, the thin sheet carrier 102 may be a laminate comprising more than one sheet 102, 108.

In other alternatives, the patterned microstructures 104, 106 may be formed from multiple layers of material; may be formed from multiple layers of material where each layer is patterned differently; may be made from photosensitive material formed by lithography, may be made from a material formed by depositing through a stencil; may be made from a material formed by deposition and subsequent cutting or etching by other means, such as by laser, sandblasting, EDM, waterjet, milling, and the like as listed above; or may be made from a material formed by selective deposition such as by nozzle-based dispensing or by printing (ink-jet or offset), as listed above.

Figure 2:
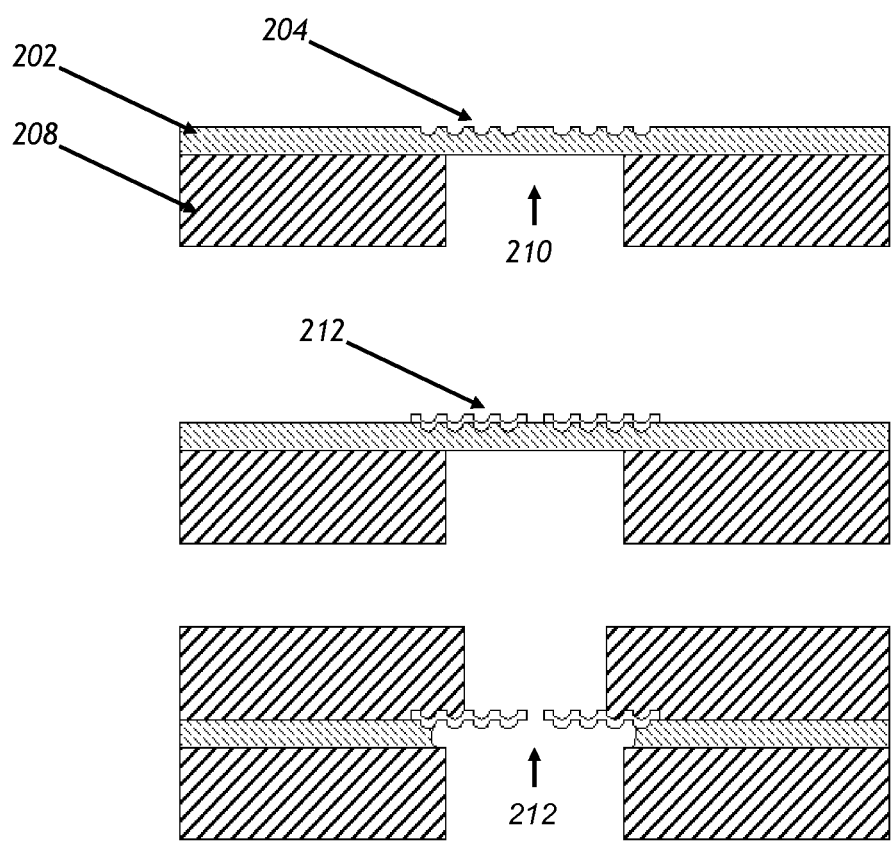
FIG. 2 is an illustration of a manufacturing process using a thin sheet carrier, where the carrier is pre-etched or otherwise structured to impart additional patterning properties to the microstructure.

Referring to FIG. 2 a manufacturing process is depicted as using a thin sheet carrier, where the carrier is pre-etched or otherwise structured to impart additional patterning properties to the microstructure. The patterned microstructure may be made more functional by performing mechanical shaping or pre-etching of the thin sheet carrier 202 to form a pre-shaped region 204. The process may proceed as before, by bonding against one or more materials 208 and machining the materials to form, e.g., an opening 210. Deposition of the microstructure 212 over the pre-shaped region 204 of the thin sheet carrier 202 causes it to conform to the shape of the pre-shaped region 212. After etching of the thin sheet carrier 202, the microstructure 212 is released having shapes that are defined by the pre-shaped region 204.

Figure 3:
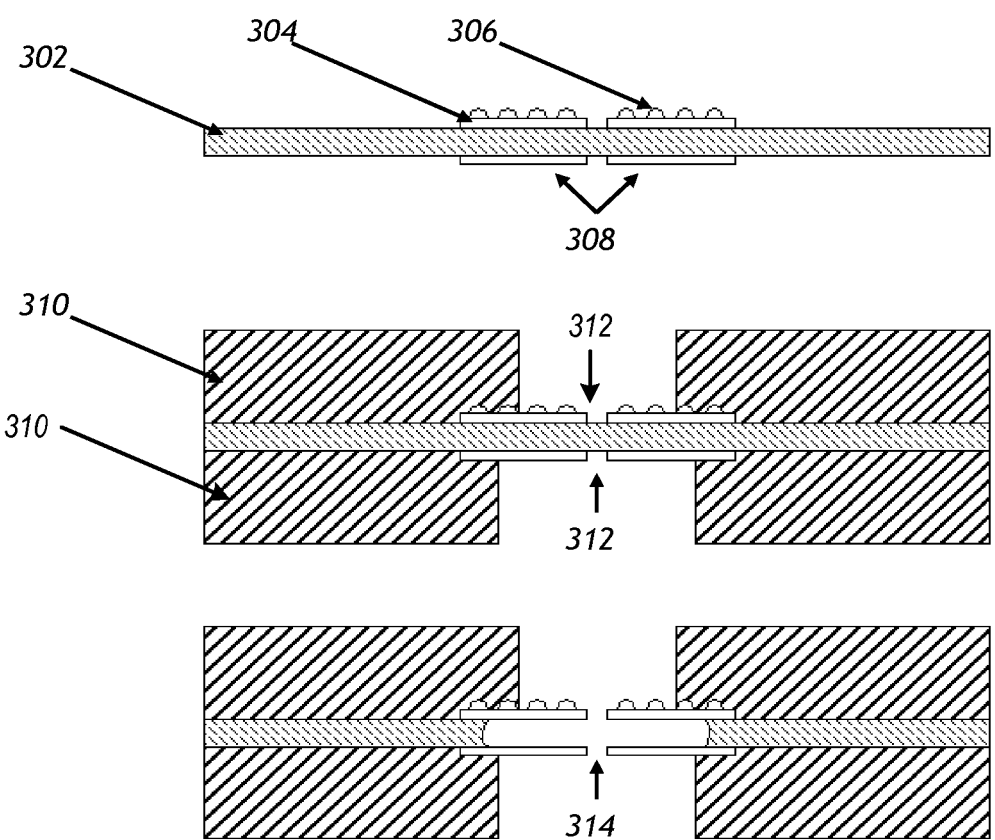
FIG. 3 is an illustration of a manufacturing process using a thin sheet carrier, where both sides of the thin sheet are patterned with microstructures prior to subsequent processing.

Referring to FIG. 3 a manufacturing process is depicted as using a thin sheet carrier, where both sides of the thin sheet are patterned with microstructures prior to subsequent processing. The patterned microstructure may be made more functional by preparing the thin carrier sheet 302 and micropatterning structures 304, 306 on both sides of the carrier sheet 302. The process may proceed as before, by bonding against one or more materials 310 and processing the materials 310 to form, e.g., openings 312 therein. Other materials layers may be added by lamination, molding, lithography, etc. After etching of the thin sheet carrier 302, the microstructure 314 is released having freestanding microstructures separated by the thickness of the thin carrier sheet 302.

Figure 4:
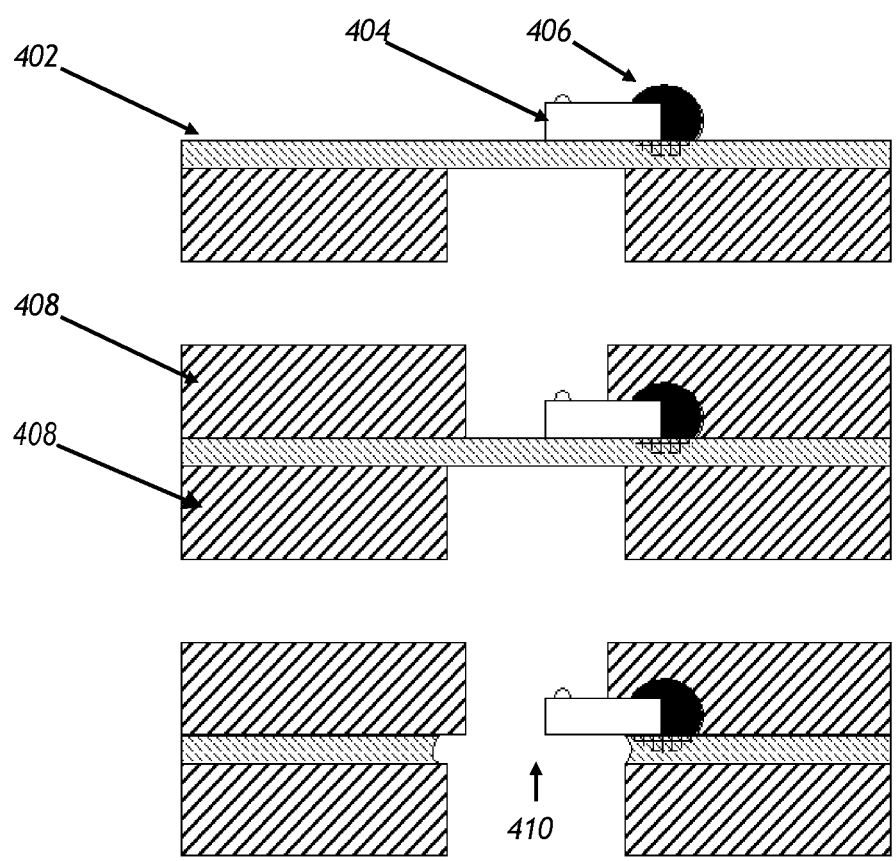
FIG. 4 is an illustration of a manufacturing process using a thin sheet carrier, where a second component is attached to the carrier prior to subsequent processing.

Referring to FIG. 4 a manufacturing process is depicted as using a thin sheet carrier, where a second component is attached to the carrier prior to subsequent processing. Alternatively, the patterned microstructure 404 may be made by a separate process, then transferred to the surface of the thin sheet carrier 402 and assembled on the surface of the thin sheet carrier surface 402, then bonded 406 to the surface. Other material layers 408 may be added by lamination, molding, lithography, etc. After etching of the thin sheet carrier 402, the microstructure is released having freestanding microstructures 410.

Free Standing Structure Using Pick and Place, Method 1.

Figure 5:
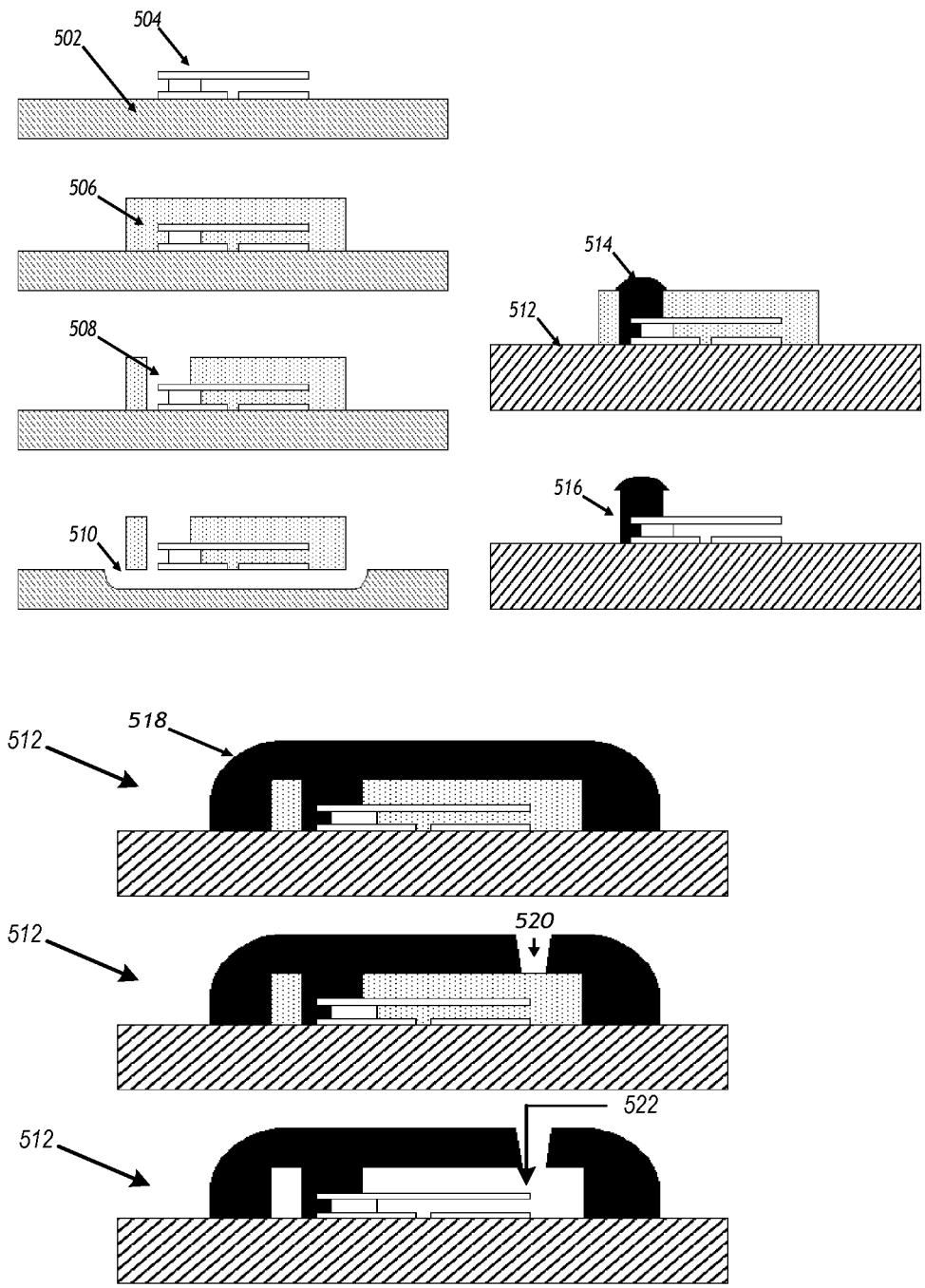
FIG. 5 is an illustration of a manufacturing process using an encapsulating material to enable a small micromachined device to be physically moved and bonded to a new carrier. This figure also shows that the encapsulating material can protect the device during high stress operations such as lamination and overmolding.

Referring to FIG. 5 a manufacturing process is depicted as using an encapsulating material to enable a small micromaehined device to be physically moved and bonded to a new carrier. This figure also shows that the encapsulating material can protect the device during high stress operations such as lamination and overmolding. A microstructure 504 is created on a carrier material 502 using any available means. In the preferred embodiment, the microsctructure 504 is defined using lithographic methods. The carrier material 502 may be any convenient material, such as a silicon wafer, glass plate, etc. A second material 506 is used to cover and encapsulate most of the microstructure. Part of the microstructure 504 is not covered, preferably the part of the microstructure 504 already attached to the carrier surface 502. The encapsulating material 506 may be applied in flowable form, or may be rigid. Furthermore, the encapsulating material 506 may be applied during the construction of the microstructure 504 as part of its natural method of manufacture.

The second material 506 may be further processed, for example to put holes 508 in it or to create functional structures on it. Processing may be by any means, including laser etch and lithography. If attached to the carrier surface 502, the microstructure 504, securely held within the encapsulant 506, is released from the carrier surface 502 by etching the carrier surface 502. For some surfaces, the adhesion between the carrier 502 and the microstructure 504 may be low, so that it can be readily removed by pulling it off. The microstructure 504, still within its encapsulant 506, is moved and further processed. The microsctructure encapsulate 504 is moved to a new carrier 512 using precision pick and place machinery. The microsctructure encapsulate 504 is bonded to the surface of the new carrier 512, for example using solder or adhesive 514. The encapsulant 506 may be removed by etching or stripping leaving an unencapsulated microstructure 516. The microsctructure 516 may be further released by etching or removing part of the new carrier surface 512. Alternatively, the microstructure 516 may be made from multiple materials. The encapsulant material 506 may also contain other materials or structures to make the encapsulating structure more useful or functional. Multiple microstructures may be encapsulated at once. Alternatively, the encapsulated device may be further encapsulated with a second encapsulating material 518. An opening 520 is made through the second material 518 or the bottom carrier 512 to provide access to the microstructure encapsulate. The first encapsulate or sacrificial material is removed by liquid or vapor etch, leaving a freestanding part within a cavity 522.

Free Standing Structure Using Pick and Place, Method 2.

Figure 6:
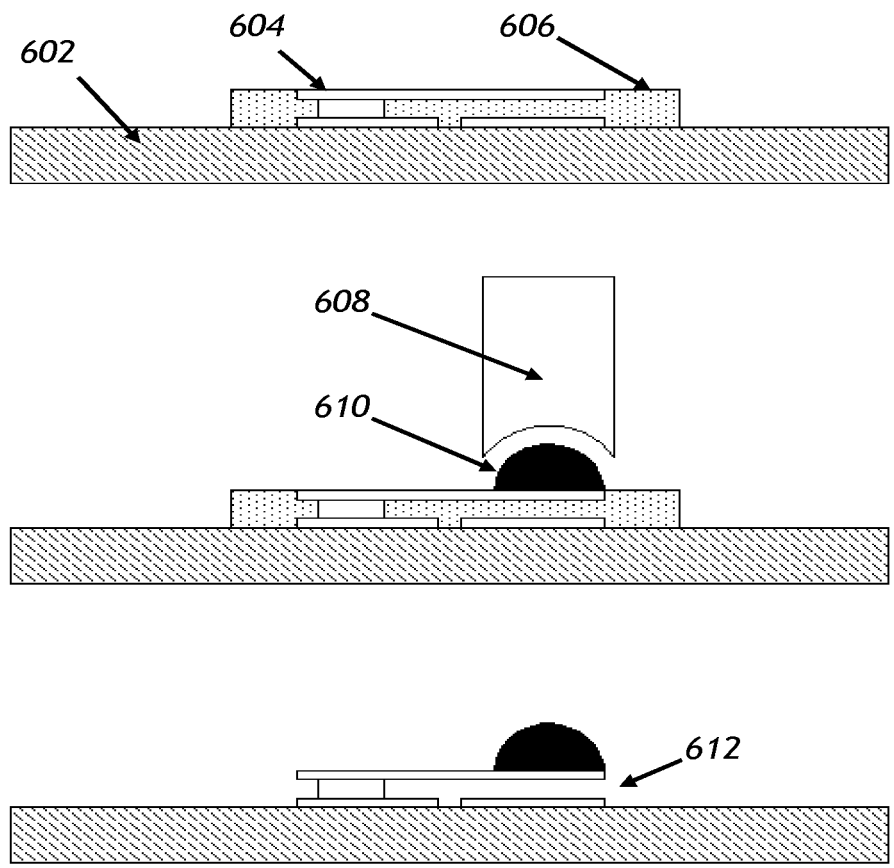
FIG. 6 is an illustration of a manufacturing process using an encapsulating material to provide enough rigidity in a micromachined device to allow a pick and place operation to place and bond more components on the microdevice, thus increasing the complexity and function of the microdevice.

Referring to FIG. 6 a manufacturing process is depicted as using an encapsulating material to provide enough rigidity in a micromachined device to allow a pick and place operation to place and bond more components on the microdevice, thus increasing the complexity and function of the microdevice. The process includes creating a microstructure 604 is created on a carrier 602 using any conventional means. The microstructure remains encapsulated in its sacrificial material 606 and is not freestanding. A second component 610 is mechanically placed on the first microstructure to add functionality to the first microstructure. Placement may be performed by any convenient means, such as by pick and place machinery 608. Since the first microstructure 604 remains embedded within its sacrificial material 606, it can survive the forces associated with the pick and place operation. The second component 610 is bonded to the first microstructure 604. After all subsequent operations, including the optional placement of other components on the microstructure 604, the microstructure 604 is released by selective removal or etch of the sacrificial material 606. The result is a freestanding microstructure 612 containing components that are bonded to it which would normally not be possible to bond to a micromachined device.

Free Standing Structure Using Laminated Mold Cavity, Method 1.

Figure 7:
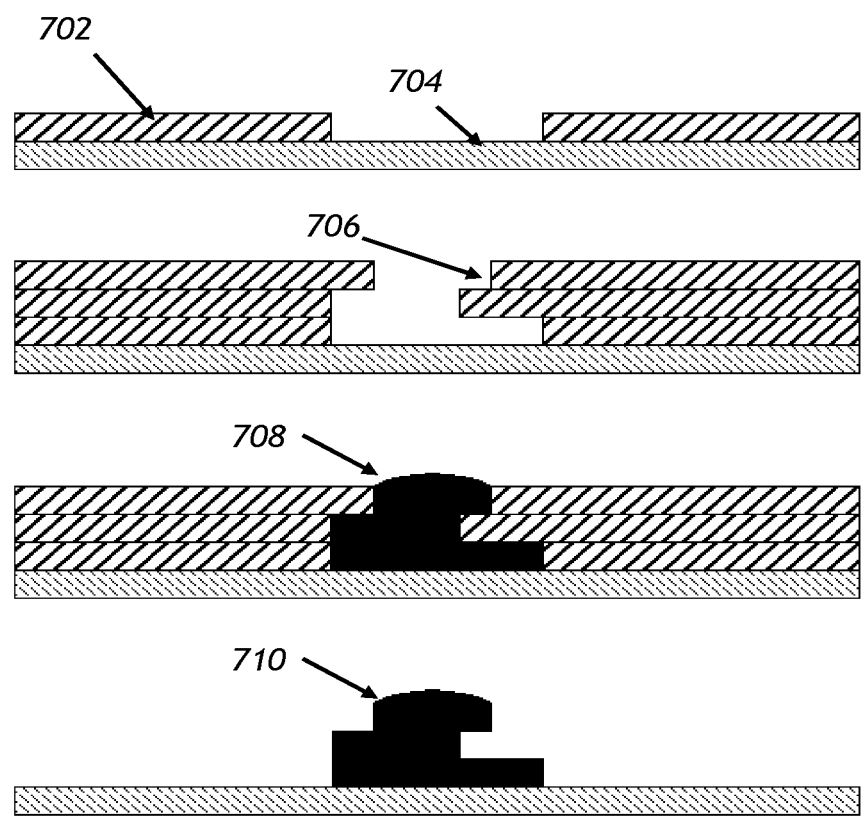
FIG. 7 is an illustration of a manufacturing process using several layers of laminating materials to form a hollow mold cavity that can be used for injecting a second material, thus forming a 3-D device.

Referring to FIG. 7 a manufacturing process depicted as using several layers of laminating materials to form a hollow mold cavity that can be used for injecting a second material, thus forming a 3-D device. The process includes preparing layers of laminate sheets 702 are prepared on a carrier material 704. Openings are cut into the laminate sheets 702 either prior to lamination or after lamination. Sheets 702 are laminated together to produce a layered structure. Openings 706 in sheets 702 overlap to form a cavity. Material 708 is formed in the cavity by flowing material, electroplating, or other means. Portions of the laminate adjacent to the cavities are etched away to reveal a freestanding part 710. Some laminate layers 702 may be made of different materials that are not etched away at the end of the process, or may leave parts embedded within the freestanding part.

Some laminate layers 702 may consist of multiple layers themselves, prepared in advance in order to embed a microstructure in the mold part. Local fiducials and targets may be added to the laminate to guide the cutting tool and ensure high precision overlap from layer to layer. Cutting or etching may be performed through a mask or stencil, where the mask or stencil is aligned with the laminate surface prior to cutting.

Figure 8:
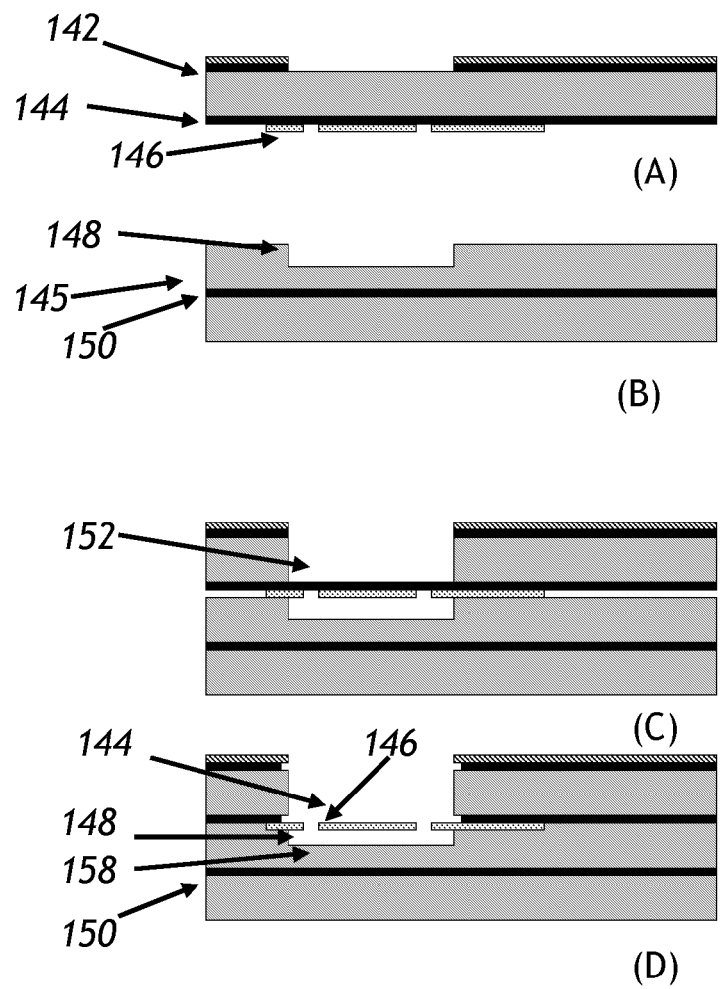
FIG. 8 is a diagram showing a process for fabricating a microdevice within a substrate.

The following describes different methods for building a microdevice within a laminate. In the first embodiment, shown in FIG. 8, two halves of the laminate are prepared in advance. The top half contains a laminate layer 142 and a first metal foil 144, such as copper, bonded to the laminate layer 142. A second metal foil 146, such as gold, is patterned over the first metal foil 144. The second metal is chosen for good mechanical and electrical properties, and because it is resistant to chemicals that would ordinarily etch the first metal. The second laminate layer 145 consists of laminate material that has a cavity 148 within it. The cavity 148 can be created using etching, cutting, ablation, drilling or other methods. Beneath the cavity 148 is a third metal foil 150, such as copper. The two halves 142 and 145 are bonded together to place the patterned metal over the cavity 148. An opening 152 is cut into the top layer 142 to expose the first metal foil 144. The opening 152 can be created using etching, cutting, ablation, drilling or other methods. The opening 152 may be created at any time, such as before the first foil 144 is bonded to the top laminate 142. Finally, a chemical etchant is introduced into the opening to etch the first metal foil (144). In the preferred embodiment, the etchant may be ammonium persulfate or ferric chloride which efficiently etch copper but which do not etch gold. The etching process removes the first metal layer 144 but does not affect the second patterned metal 146. This "release etch" leaves a freestanding movable structure 156 which can be used as the acoustic element. Electrical acoustic of the movable structure can occur at the third metal layer 150 that monitors the change in capacitance through the cavity 148 and laminate material 158.

Figure 9:
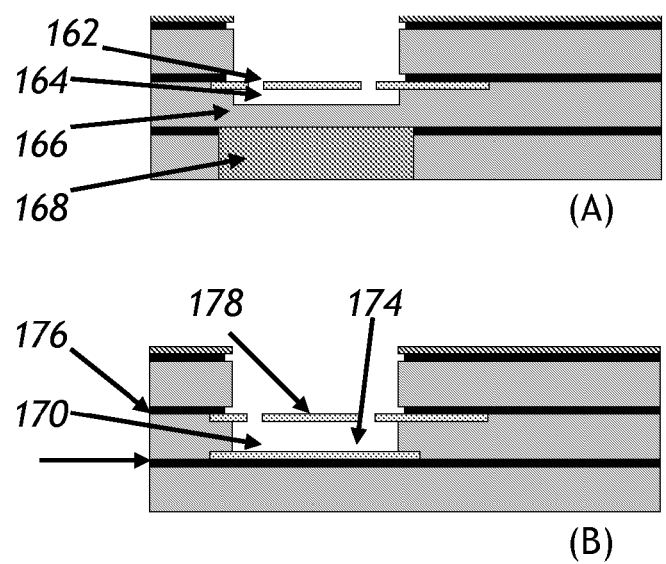
FIG. 9 is a diagram showing a process of fabricating a microdevice with an electret and with an all-air gap.

A variation of this embodiment may be realized by substituting the second layer with a laminate containing a charged electret, as seen in FIG. 9A. In this device, the freestanding structure 162 is suspended over a cavity 164 which is created in a laminate layer 166 and which also contains a charged electret material 168. A still different embodiment can be accomplished if the design requires an all-air gap between the two conductive layers. In this embodiment, a cavity 170 is created that passes through the laminate to the third metal foil 172. If the third metal foil 172 is made from a suitably different metal than the first metal foil 176, the release etching will not harm this layer. Alternatively, layer 174 comprised of a fourth metal may be patterned over the third metal foil 172. This metal is selected to be resistant to the etchant used to remove the first metal foil. The bottom layer 172 of metal is protected during the release etch. This leaves two metals 174 and 178 separated by an air gap at the completion of etching.

Another embodiment of the manufacturing process is shown in FIG. 10. Here a metal foil 182, preferably copper, is prepared as usual on the surface of a laminate layer 188. A second metal 184, preferably gold, is patterned on top of the first metal foil, having different etch properties from the first. A new laminate layer 185 containing an opening 186 is bonded to the first layers 188 to complete the laminate structure 180. The first metal 182 is etched using an appropriate chemical to leave a thin open cavity 190 below the second patterned metal 184, thus releasing the metal and yielding a free-standing structure. Etchant chemical may access the metal foil through openings in the patterned metal. The first layer 188 may be a dielectric or may contain charged elements making the device an electret. If the layer 188 is non-conductive, then acoustic of the acoustic element can occur at conductive layers below the non-conductive layer.

Another embodiment of the manufacturing process is shown in FIG. 11. In this embodiment, a top laminate layer 203 is prepared having an opening 201 in it. A metal foil 205, preferably copper, is prepared with a second metal 207 patterned on its top side and a third metal 209 patterned on its bottom side. The patterned metal is preferably gold. A second laminate layer 211 is also prepared. The two layers are bonded together with the patterned metal foil to form a single laminate construction 213. Etchant is introduced through the opening in the second patterned metal. The patterned metal should be resistant to the etchant, whereas the foil should be attacked by the etchant. Possible etchants are ammonium persulfate or ferric chloride which will etch copper but will not etch gold. Etching chemical can reach the foil through openings in the top patterned metal layer. After etching, only the patterned metal remains, leaving a free standing structure which is the acoustic element 215.

A variation on this embodiment is shown in FIG. 12. In this version, a charged dielectric 217 is placed under the patterned metal. After etching the metal foil, the freestanding metal is positioned over an air gap 219 and an electret, forming a microphone.

Similar embodiments can be envisioned on substrates that do not have laminate structure, but are still used for packaging, for instance metal lead frames. A metal lead frame is often used for mounting microelectronic chips and providing electrical connections to the chip. The lead frame is first cut from a single sheet of metal into its desired shape. Following this, microelectronic chips and other electrical components are attached to the surface of the lead frame, then electrical connections are made between the chip and the lead frame using techniques such as wire bonding, flip chip bonding, surface mount soldering, and the like. Finally, the circuitry is embedded within a mold compound which protects the electronics and forms the shape of the final packaged product. No MEMS device can survive this process.

Figure 13:
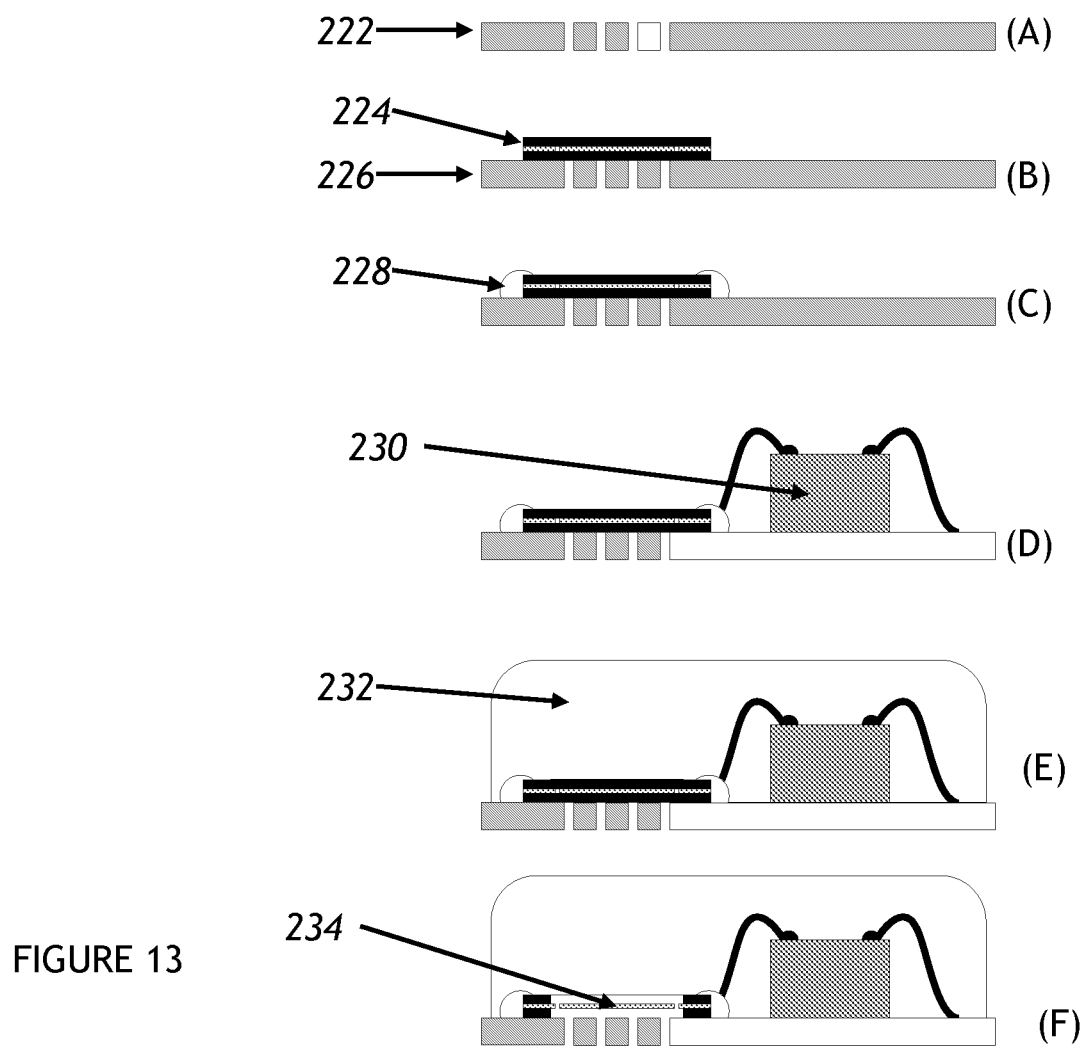
FIG. 13 is a diagram showing a process for fabricating a microdevice on a lead frame.

The following describes a method for building a microacoustic element that can be packaged on a lead frame. The basic procedure is illustrated in FIG. 13. First, a lead frame 222 is created using standard methods, such as cutting. The lead frame 222 should have small holes or openings in it to allow access to the acoustic section. Second, a metal laminate structure 224 is prepared consisting of a first metal film, with a second metal patterned on top, and a third metal film bonded to the top. The first and third metals are constructed of a metal, preferably copper, that is different from the middle metal, preferably gold or aluminum. This metal laminate 224 is bonded to the top of the lead frame 226. Electrical connections 228 between the lead frame and the metal sandwich structure are made by any method, such as soldering or metal welding. Following this, the lead frame is used for mounting further microelectronic parts such as chips and passive components. Parts 230 are mounted and electrically connected using industry standard methods, such as pick-and-place, wire bonding, flip chip bonding, surface mount soldering, and the like. The assembly is then encapsulated in protective material 232 such as epoxy using normal packaging methods. After encapsulation, etchant is allowed to penetrate through the access holes in the lead frame to etch the metal laminate structure. The etchant is selected to etch only the first and third metal foils, and not the middle patterned metal. After etching, a free standing structure 234 is left that can be used as an acoustic device. Alternative embodiments are readily imagined by injection molding vents and acoustic ports into the encapsulant.

These embodiments are meant to be illustrative examples and not exhaustive of the types of post-semiconductor manufacturing that can result in 3-D microstructures and freestanding parts.

While the invention is susceptible to various modifications, and alternative forms, specific examples thereof have been shown in the drawings and are herein described in detail. It should be understood, however, that the invention is not to be limited to the particular forms or methods disclosed, but to the contrary, the invention is to cover all modifications, equivalents and alternatives falling within the spirit and scope of the appended claims.

What is claimed:

1. A method of manufacturing a free standing micro-device, comprising:
   (a) preparing a first carrier layer, the first carrier layer being a laminate layer;
   (b) preparing a second carrier layer, the second carrier layer being a laminate layer and being manufactured separately from the first carrier layer; and
   (c) bonding the first carrier layer to the second carrier layer to produce the free standing micro-device.

2. The method of claim 1 wherein one of the first carrier layer and second carrier layer is copper foil.

3. The method of claim 1 wherein the a material is electroplated on one or more of the first carrier layer and the second carrier layer.

4. The method of claim 1 wherein multiple free standing micro-devices are manufactured in a batch, wherein each of the first carrier layer and the second carrier layer carries a plurality of free standing micro-devices.

5. The method of claim 1 wherein the first carrier layer and second carrier layer are bonded against a third material by lamination, molding, deposition, or electroplating.

6. The method of claim 5 wherein the third material includes openings and structures.

7. The method of claim 1 further comprising etching away at least a portion of the first carrier layer and second carrier layer to reveal a freestanding micro device structure.

8. The method of claim 1 wherein one or more of the first carrier layer and the second carrier layer is a laminate comprising more than one sheet.

9. The method of claim 1 wherein the free standing micro-device is made from multiple layers of material.

10. The method of claim 1 wherein the free standing microdevice is made from multiple layers of material, each having a different pattern.

11. The method of claim 1 wherein the free standing microdevice is made from photosensitive material formed by lithography.

12. The method of claim 1 wherein the free standing microdevice is made from a material formed by depositing through a stencil.

13. The method of claim 1 wherein the free standing microdevice is made from a material formed by selective deposition, wherein the selective deposition is one of nozzle-based dispensing or printing (ink-jet or offset).

14. The method of claim 1 further comprising mechanical shaping or pre-etching one or more of the first carrier layer and the second carrier layer.

15. The method of claim 1 further comprising micropatterning structures on both sides of one or more of the first carrier layer and the second the carrier layer.

16. The method of claim 1 wherein the free standing microdevice is made from a material formed by deposition and subsequent cutting or etching.

17. The method of claim 1 wherein the free standing microdevice is movable.

18. The method of claim 1, wherein one or more materials are removed after bonding the first carrier layer to the second carrier layer.

19. The method of claim 18, wherein the one or more materials are removed by one or more of solution etching, vapor etching, heating, evaporation, and displacement.

20. The method of claim 1, wherein preparing one or more of the first carrier layer and the second carrier layer consists of one or more manufacturing processes including lithography, etch, electroplating, machining, abrasion, punching, drilling, bonding, welding, electric discharge.

* * * * *